United States Patent [19]
Gratrex et al.

[11] Patent Number: 5,847,670
[45] Date of Patent: Dec. 8, 1998

[54] OFFSET VOLTAGE COMPENSATION FOR VOLTAGE COMPARATORS

[75] Inventors: Alistair John Gratrex, Bracknell; Kenneth Stephen Hunt, Crowthorne, both of United Kingdom

[73] Assignee: LSI Logic, Milpitas, Calif.

[21] Appl. No.: 806,389

[22] Filed: Feb. 28, 1997

[30] Foreign Application Priority Data

Mar. 20, 1996 [GB] United Kingdom ................... 9605886

[51] Int. Cl.⁶ .................................................. H03M 1/12
[52] U.S. Cl. ........................................... 341/159; 341/155
[58] Field of Search ..................... 341/159, 161, 341/164, 155; 327/63, 70, 205, 540

[56] References Cited

U.S. PATENT DOCUMENTS 4,760,286  7/1988  Pigott .

5,426,386  6/1995  Mattews et al. ........................... 327/63

*Primary Examiner*—Brian K. Young

[57] ABSTRACT

A voltage comparator circuit includes a comparator 42 having a first comparison input, a second comparison input and first and second switched current memories 52, 58 (e.g., switched FETs) connectable, respectively, to the first and second comparator inputs for input voltage offset compensation. In use, during a storage phase, a current value is stored in the switched current memory for each of the first and second comparison inputs and, during a comparison phase, the stored current values are used to compensate for voltage offsets between the comparison inputs.

12 Claims, 5 Drawing Sheets

OFFSET VOLTAGE COMPENSATION FOR VOLTAGE COMPARATORS

CROSS REFERENCE TO RELATED APPLICATION

This patent application is related to and claims foreign priority under 35 U.S.C. § 119 of United Kingdom Patent Application No. 9605886.2, filed Mar. 20, 1996, and incorporated by reference herein.

BACKGROUND OF THE INVENTION

1. Field of the Invention

The present invention relates to offset voltage compensation for voltage comparators.

2. Description of the Prior Art

FIG. 1 of the accompanying drawings is a schematic circuit diagram of a conventional voltage comparator including offset voltage compensation, also known as offset nulling, through the use of a capacitor to store an input offset voltage. Offset voltages, and the need to compensate for them, can arise for example, due to circuit tolerances.

In FIG. 1, a comparator 10 with inverting '−' 11 and non-inverting '+' 13 inputs is represented as having a voltage offset 12 at the non-inverting input 13. The circuit is driven by two non-overlapping clocks CLKA 32 and CLKB 34. When the clock CLKA 32 is high, a switch (e.g. a field effect transistor (FET)) 30 connects the inverting input 11 and the output 18 of the comparator 10. At the same time the switches (e.g. FETs) 26 and 28 are switched by the clock CLKA 32 so that a capacitor 14 is connected across the inverting 11 and non-inverting 13 inputs to the comparator 10, and one side of the capacitor 14 (the side connected to the non-inverting input 13 of the comparator 10) is connected to ground 36. In this manner the comparator 10 becomes connected as a unity gain buffer with the capacitor 14 connected across its inputs. During this phase of operation, any offset voltage across the inputs 11 and 13 to the comparator 10 appears across and is stored on the capacitor 14. When the CLKB 34 goes high, a switch (e.g., a FET) 22 connects the voltage to be sampled to the inverting input 11 of the comparator 10 and a switch (e.g., a PET) 24 connects the side of the capacitor opposite to that of the switch 28 (that is the side connected to the inverting input 11 of the comparator 10) to ground 36. Accordingly, in this phase the capacitor 14 is connected in series with the non-inverting input 11 of the comparator 10 and serves to subtract the offset voltage from this input.

The nulling process described above presents a number of problems. One of these is that it requires the provision of a fully floating capacitor, which means that double polysilicon processing is required for manufacturing the circuit. Another problem is that the comparator must be unity gain stable. In other words, care must be taken in the selection of the comparator to avoid the risk of comparator oscillation. A further disadvantage is the circuit real estate needed for the capacitor, which must be large to be effective. The overall capacitance is also dependent on the size of the input transistors. The use of large area input transistors would mean that the comparator would have a very large input capacitance and when used in flash analog to digital converters, this capacitance may limit device performance.

SUMMARY OF THE INVENTION

An object of the invention, therefore, is to provide a voltage comparator circuit which mitigates the disadvantages of the prior art.

In accordance with a first aspect of the invention, there is provided a voltage comparator circuit comprising a comparator having a first comparison input and a second comparison input, and first and second switched current memories connectable respectively to the first and second comparison inputs for input voltage offset compensation.

The use of a voltage comparator circuit having switched current memories for nulling comparator input voltage offsets avoids the need for a unity gain stable comparator and also avoids the need for a fully floating capacitor. As a result of this, the comparator can be manufactured using a single polysilicon process. It can also be made on a small area. As the memory effect is not achieved using a capacitor, the voltage dependency of the prior art caused by the use of the capacitor is removed.

Preferably, each current memory comprises a current storage field effect transistor switched by means of a first switch for shorting a gate and either a source or a drain of the current storage field effect transistor, the first switch being responsive to a first clock signal. This provides a compact current memory circuit with a low device count.

Preferably, the voltage comparator circuit comprises: a first input device having a first input connected to the first voltage input, a second input connected to a current source and an output connected to the first comparison input; and a second input device having a first input connected to the second voltage input, a second input connected to the current source and an output connected to the second comparison input; the first switched current memory being connectable to the output of the first input device and the second switched current memory being connectable to the output of the second input device. Preferably, in this arrangement, the first switched current memory is connectable between the output of the first input device and a reference line (e.g., common ground) and the second switched current memory is connectable between the output of the second input device and the reference line. The voltage comparator circuit preferably comprises a second switch for shorting the first inputs of the first and second input devices together, the first and second switches being responsive to a first clock signal.

Preferably also, the input of an input device is connected to a voltage input via a third switch, the third switch being responsive to a second clock signal.

In a preferred embodiment, the or each switch is a field effect transistor, the gate of which is connected to receive the appropriate clock signal.

Also, in a preferred embodiment: the first input device is a field effect transistor, a gate of which is connected to the first voltage input, a source or a drain of which is connected to a current supply and the other of the drain or source of which is connected to the first comparison input; and the second input device is a field effect transistor, a gate of which is connected to the second voltage input, a source or a drain of which is connected to a supply voltage and the other of the drain or source of which is connected to the first comparison input.

In accordance with a second aspect of the invention, there is provided a method of operating a voltage comparator circuit as defined above, the method comprising steps of: (i) during a storage phase, storing a current value in a switched current memory for each of first and second comparison inputs; and (ii) during a comparison phase, using the stored current values to compensate for voltage offsets between the comparison inputs.

Preferably, step (i) comprises, in response to a first clock signal: shorting a gate/source or a gate/drain junction of a current memory transistor in each of first and second switched current memories; and shorting first inputs of each of first and second input device transistors, whereby a current flowing in the current memory transistor of the first switched current memory equals current flowing in the first input device transistor and a current flowing in the current memory transistor of the second switched current memory equals current flowing in the second input device transistor.

Preferably, step (ii) comprises, in response to the end of the first clock signal and the supply of a second clock signal: removing the short across the gate/source or gate/drain junction of the current memory transistor in each of the first and second switched current memories; removing the short between the first inputs of each of first and second input device transistors; and connecting the first voltage comparator input to the first input device transistor, whereby currents in the current memory transistor of each of the first and second switched current memories compensate for an input voltage offset for the comparator.

The invention also provides an integrated circuit comprising a voltage comparator circuit as defined above.

The invention further provides an analog to digital converter comprising a voltage comparator circuit as defined above and an integrated circuit comprising such an analog to digital converter.

BRIEF DESCRIPTION OF THE DRAWINGS

An embodiment of the invention is described hereinafter, by way of example only, with reference to the accompanying drawings, wherein.

DESCRIPTION OF PREFERRED EMBODIMENTS

Figure 1:
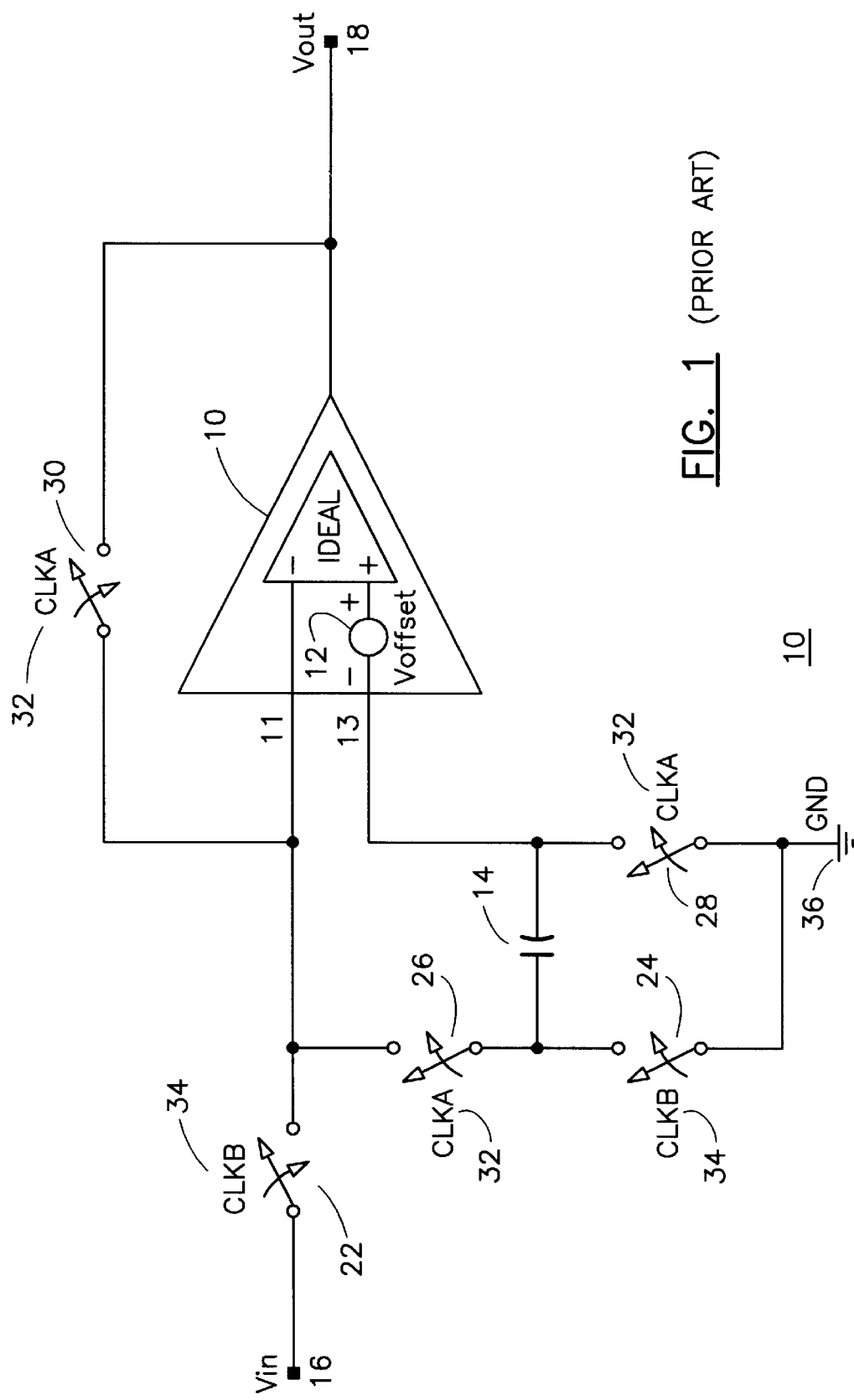
FIG. 1 is a schematic diagram of a conventional switched capacitor voltage comparator circuit.
Figure 2:
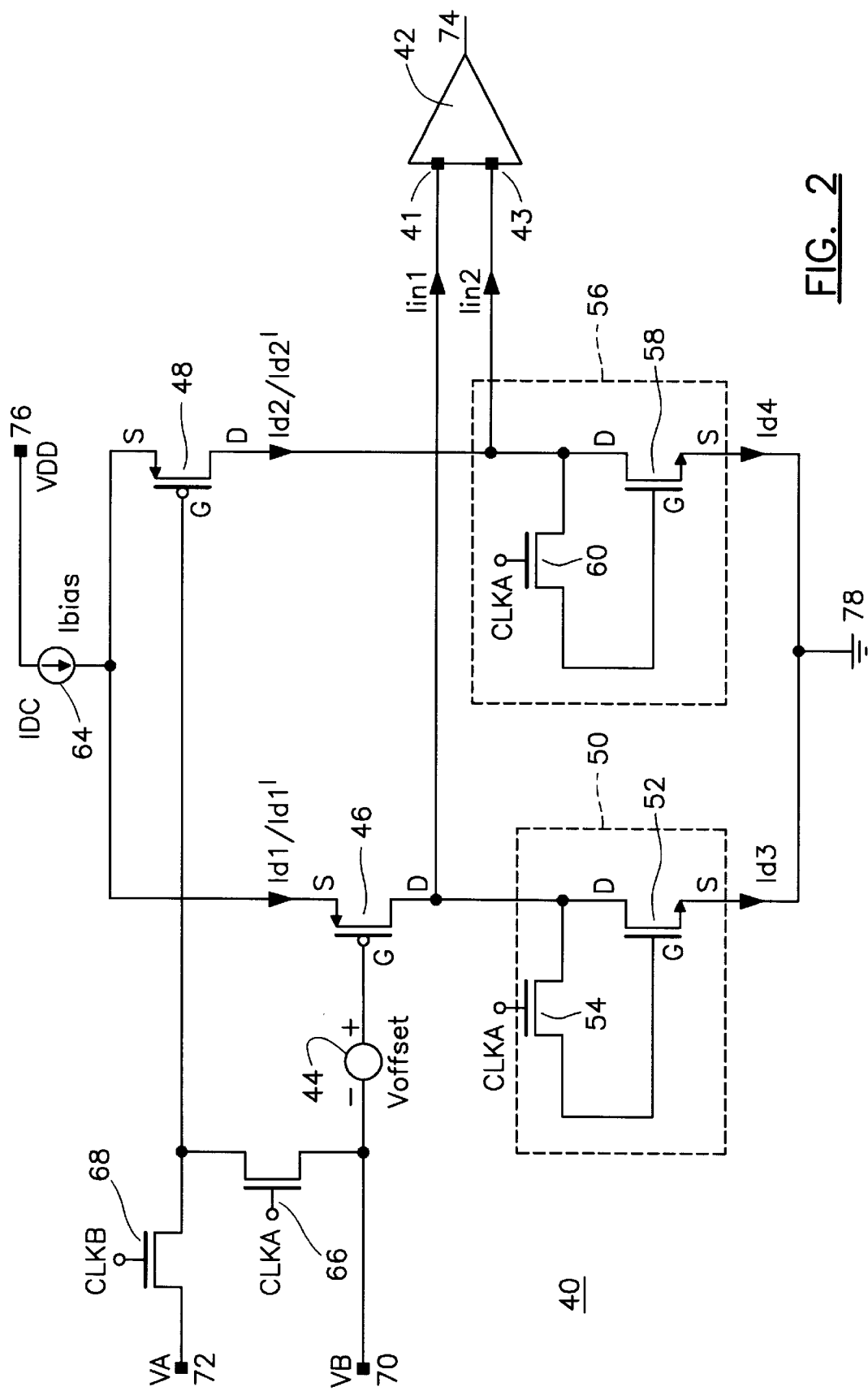
FIG. 2 is a schematic diagram of an example of a voltage comparator circuit in accordance with the invention.

FIG. 2 is a schematic diagram of an example of a voltage comparator circuit 40 in accordance with the invention. In this circuit a current source 64 is connected to a voltage rail VDD 76. The output of the current source 64 is connected to the sources of first and second FETs (here P-channel FETs or P-FETs) forming first and second input devices 46 and 48, respectively. The drains of the first and second input devices 46 and 48 are connected, respectively, to first and second inputs 41 and 43 of a comparator 42. The output of the comparator 42 forms the output 74 from the voltage comparator circuit 40.

The gate of the first input device 46 is connected to a first voltage input 70. In FIG. 2 the offset voltage is represented at 44 in the line between the first input device 46 and the first voltage input 70, although this could alternatively be represented in one of the lines to the inputs 41 or 43 to the comparator 42.

The gate of the second input device 48 is connected to a second voltage input 72 via a switch 68. The switch 68 closes in response to a second clock signal CLKB to connect the second input 72 to the gate of the second input device 48 as will be described below.

The line between the first input device 46 and the first voltage input 70 and the line between the second input device 48 and the second voltage input 72 can be connected by means of a switch 66, which closes in response to a first clock signal CLKA to short the gates of the first and second input devices 46 and 48 as will be described below.

The drain of the first input device 46 is also connected to a first terminal of a first switchable current memory circuit 50, a second terminal of which is connected to a voltage reference (here ground 78). The first switchable current memory circuit 50 comprises an FET (here an N-channel FET or N-FET) forming a first current memory device 52, the drain of which is connected to the drain of the first input device 46 and the source of which is connected to ground 78. A switch 54 is connected between the gate and the drain of the first current memory device 52. The switch 54 closes in response to the first clock signal CLKA to short the gate and drain of the first current memory device 52, as will be described below.

The drain of the second input device 48 is also connected to a first terminal of a second switchable current memory circuit 56, a second terminal of which is connected to the voltage reference (here ground 78). The second switchable current memory circuit 56 comprises an FET (here an N-FET) forming a second current memory device 58, the drain of which is connected to the drain of the second input device 48 and the source of which is connected to ground 78. A switch 60 is connected between the gate and the drain of the second current memory device 58. The switch 60 closes in response to the first clock signal CLKA to short the gate and drain of the second current memory device 58, as will be described below.

The operation of the circuit of FIG. 2 will now be described. The circuit operates with the two clocks CLKA and CLKB, which are non-overlapping. When the first clock CLKA goes high, the inputs to the input devices 46 and 48 are shorted together as switch 66 closes and each of the current memory devices 52 and 54 has its gate and drain shorted together as the switches 54 and 60 close. As a result of this the drain current Id3 in the first current memory device 52 corresponds to that Id1 in the first input device 46 and the drain current Id4 in the second current memory device 58 corresponds to that Id2 in the second input device 48. Accordingly, any offset voltage between the first and second input devices will result in different currents Id1 and Id2.

When the first clock CLKA goes low, the gates 66, 54 and 60 open. However, the drain currents in the current storage devices continue to flow as the gate voltages of these devices are maintained by the gate source capacitance of the devices.

Then, when the second clock CLKB goes high, the switch 68 closes and the input voltage is connected to the input devices 46 and 48 of the comparator 40. The drain currents in the first and second input devices 46 and 48 are then set up by the voltages input at the first and second voltage inputs 70 and 72, respectively.

The current supplied to the first input 41 of the comparator 42, Iin1, is then defined by Iin1=Id1'–Id3, that is the difference between the new current Id1' through the first input device 46 and the 'offset' current Id3 stored on the first current memory device 52. Similarly, the current supplied to the second input 43 of the comparator 42, Iin2, is then defined by Iin2=Id2'–Id4, that is the difference between the new current Id2' through the second input device 48 and the 'offset' current Id4 stored on the second current memory device 58. The result of this is to remove the effect of the offset.

In the present embodiment, each of the switches 54, 60, 66 and 68 is implemented by an N-FET, with the source and drain of the FET connected to the line concerned and the gate of the FET connected to the appropriate clock signal line.

Figure 3:
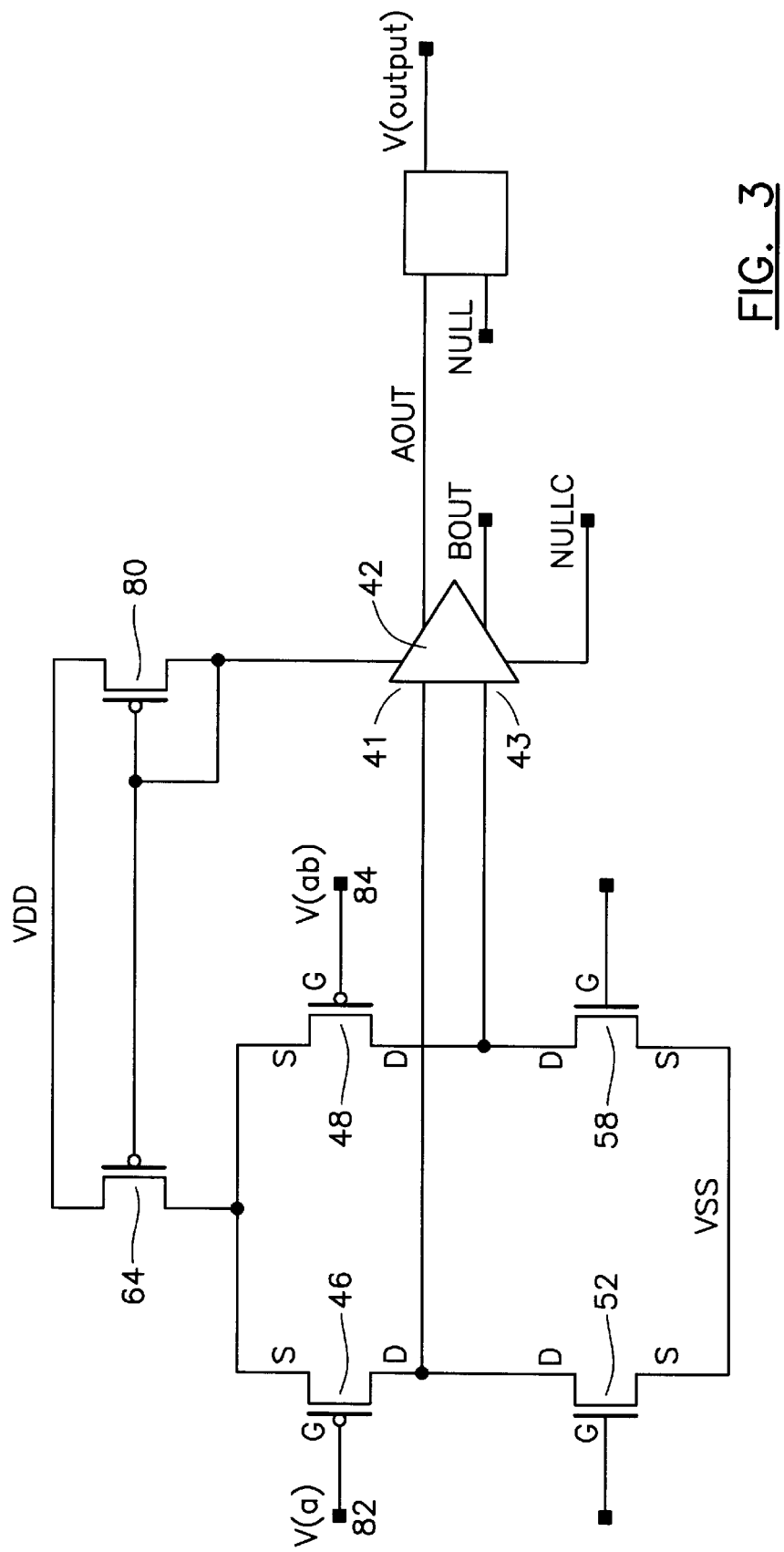
FIG. 3 is a schematic circuit diagram representing a simulation of a voltage comparator circuit in accordance with the invention.
Figure 4:
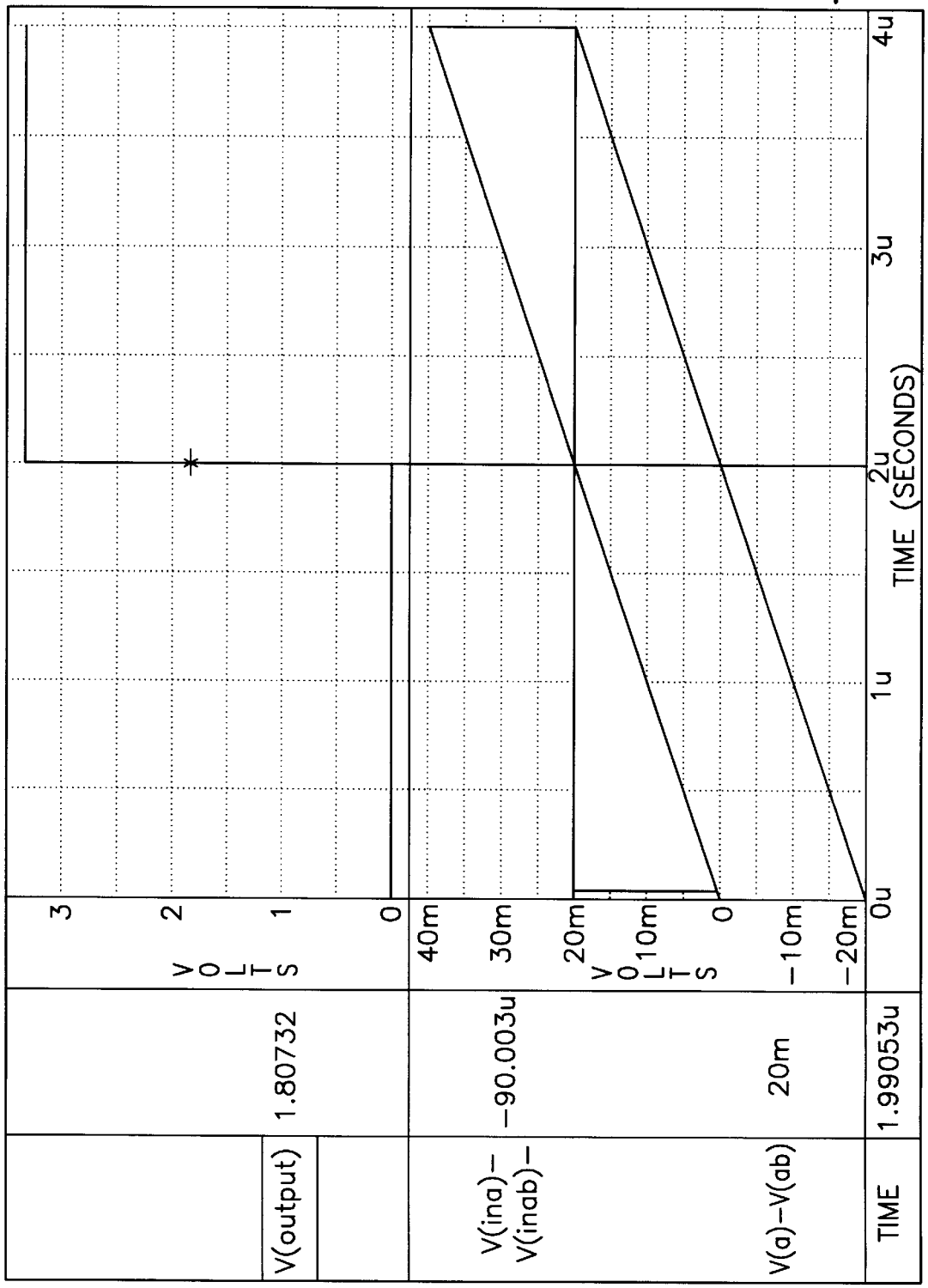
FIG. 4 is a graph illustrating aspects of the operation of the circuits of the invention.

The operation of the circuit of FIG. 2 will also be described with reference to a simulated circuit shown in FIG. 3 which uses real and simulated components. In the circuit illustrated in FIG. 3, the current source 64 (FIG. 2) is formed by a P-FET 64, the gate of which is connected to a bias circuit, also formed by a P-FET 80 for supplying a bias voltage to the comparator 42. Not shown in FIG. 3 are the switches 54, 60, 66 and 68, and the short circuits for the switches 54, 60 and 66. FIG. 4 illustrates the result of the simulation of an example of a voltage comparator circuit in accordance with the present invention. In the simulation, it is assumed that there is a 20 mV offset between the two inputs 41 and 43 of the comparator 42. A terminal 84 is held at a constant voltage V(ab) while the voltage V(a) at a terminal 82 is swept from V(ab)−20 mV to V(ab)+20 mV. The plot in FIG. 4 shows the differential voltage between the ideal comparator inputs 41 and 43, which shows the inputs being shorted together and then the input 41 being connected to the input voltage ramp V(a). The output of the whole circuit V(output) is also plotted in FIG. 4 and this shows that the comparator decision point occurs when V(a)−V(ab) is 90 $\mu$V and the offset has been nulled from 20 mV, which is the difference between the inputs 41 and 43 at this point.

In use, therefore, the voltage comparator circuit functions in two distinct phases under the control of the non-overlapping clock signals CLKA and CLKB. During a storage phase, a current value is stored in a switched current memory for each of first and second comparison inputs. During a comparison phase, the stored current values compensate for voltage offsets between the comparison inputs. In the storage phase, in response to a first clock signal CLKA, a gate/source or a gate/drain junction (depending on the FET implementation) of a current memory transistor in each of first and second switched current memories is shorted and first inputs of each of first and second input device transistors are shorted, whereby a current flowing in the current memory transistor of the first switched current memory equals current flowing in the first input device transistor and a current flowing in the current memory transistor of the second switched current memory equals current flowing in the second input device transistor. In the comparison phase, in response to the end of the first clock signal and the supply of a second clock signal, the short across the gate/source or gate/drain junction of the current memory transistor in each of the first and second switched current memories is removed, the short between the first inputs of each of first and second input device transistors is removed, and the voltage comparator inputs are connected to the input device transistors, whereby currents in the current memory transistor of each of the first and second switched current memories compensate for an input voltage offset for the comparator.

Figure 5:
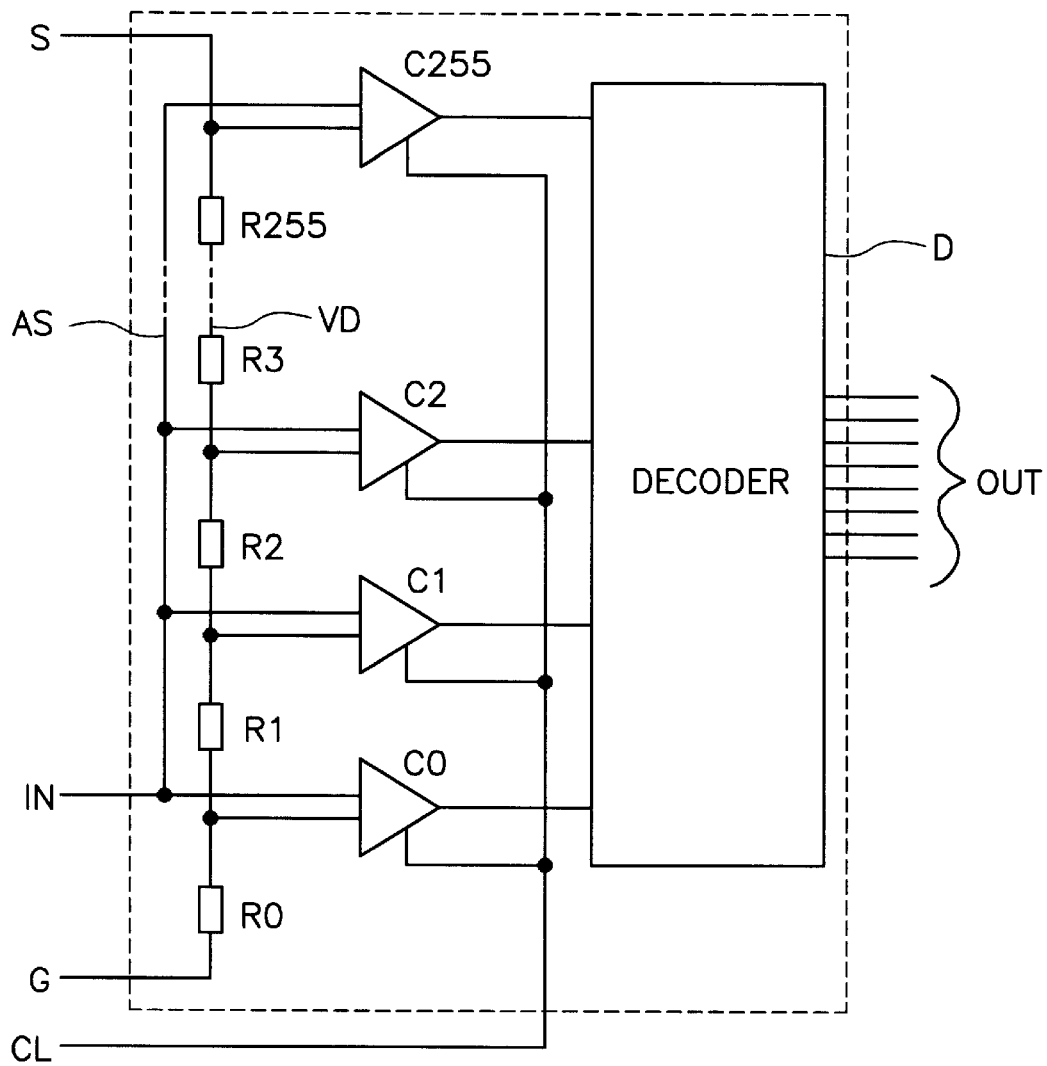
FIG. 5 is a schematic block diagram of a flash analog to digital converter.

FIG. 5 illustrates an example of a "flash" analog to digital converter. This comprises an analog input IN, a voltage divider in the form of a resistor chain R0, R1, R2, R3, . . . , R255 which extends between a first reference voltage line G (e.g., at ground potential) and a supply voltage line S (for example, a positive supply voltage). A plurality of comparators C0, C1, C2, . . . , C255, of the type described herein, is connected in parallel via an analog signal line AS to the input IN and each of the comparators C0, C1, C2, . . . , C255 is connected to a respective voltage tap in the voltage divider chain R0–R255. In order to take account of changing input voltages, the comparators C0, C1, C2, . . . , C255 sample the input voltage at the input IN in response to a clock signal supplied at CL.

A binary signal is output from each of the comparators C0, C1, C2, . . . , C255 to indicate whether the input signal IN when it is sampled is greater or less than the reference voltage supplied at the reference input to the comparator concerned. Typically, a logical one output is output from a comparator C0, C1, C2, . . . , C255 if the input voltage is greater than the reference voltage at its reference input. For example, if the input voltage at a particular sample time is intermediate the reference voltages at comparators C1 and C2, the output from comparators C1 and C0 will be 1 and the output from all other comparators will be 0. Similarly, if the input voltage at IN is intermediate the reference voltages input at the reference inputs to comparators C40 and C41, the output of comparators C0–C40 will be 1 and the output of all the other comparators will be 0.

In order to provide a compact binary output in the circuit illustrated in FIG. 5, an eight bit binary output OUT from a decoder D is provided for decoding the signals output by the comparators C0–C255. It will be appreciated in the particular examples shown herein that, in order to provide a linear conversion from the analog input voltages at IN to an eight bit binary output at OUT, 256 comparators C0–C255 are required having as reference inputs respective taps in a linear chain of 256 resistive elements R0–R255, each resistive element having a predetermined resistance r.

With the two examples mentioned above, the digital output for an input signal having a voltage intermediate the reference voltages for comparators C1 and C2 will be 00000010. The corresponding eight bit binary output for an input voltage at IN intermediate the reference voltages for comparators C40 and C41 will be 00010100.

Figure 6:
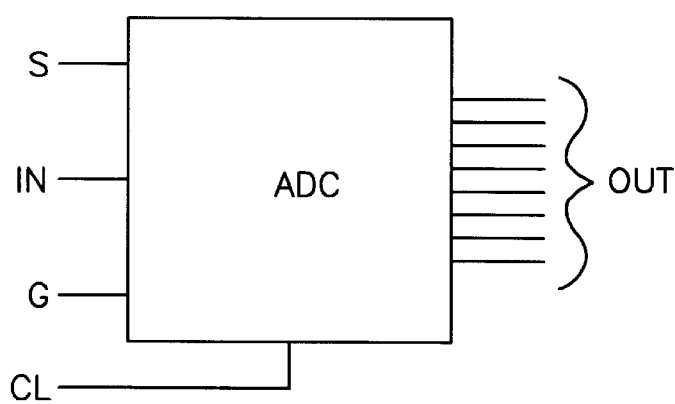
FIG. 6 is a schematic diagram of an integrated circuit incorporating a flash analog to digital converter.

FIG. 6 is a schematic representation of an integrated circuit comprising an analog to digital converter (ADC) as described above, and illustrates typical external connections. It will be appreciated that components in addition to the analog to digital converter can be incorporated in the integrated circuit.

There has been described a voltage comparison circuit employing switched current memories for nulling comparator input voltage offsets, which circuit provides a number of advantages including ease of manufacture, compactness, and high performance in use. The circuit can find application in the construction of flash analog to digital converters, where it permits in excess of 6 bit performance without having unfeasibly large input transistors, which are necessary to guarantee good matching and hence low offset voltage. As a result, the end capacitance of the circuit is reduced, which benefits the end user.

Although a particular embodiment has been described herein, it will be appreciated that the invention is not limited thereto and that many modifications and additions thereto may be made within the spirit and scope of the invention.

For example, all though a flash analog to digital converter has been described as an example of an application of a voltage comparator circuit in accordance with the invention, the voltage comparator circuit can be employed in other applications and in integrated circuit incorporating other circuits.

Moreover, although a particular circuit configuration for the voltage comparator circuit has been described, other circuit configurations and circuit technologies could be used within the spirit and scope of the invention.

What is claimed is:

1. An analog to digital converter, comprising:
   an analog to digital converter including a comparator having a first comparator input and a second comparator input and first and second current memories switchably connectable to said first and second comparator inputs, respectively, for input voltage offset compensation.

2. The analog to digital converter according to claim 1, wherein said first and second current memories are switched in response to a first clock signal.

3. The analog to digital converter according to claim 2, wherein each of said first and second current memories comprise a current storage field effect transistor switched by means of a first switch for shorting a gate and either a source or a drain of said current storage field effect transistor, said first switch being responsive to said first clock signal.

4. The analog to digital converter according to claim 2, further comprising:
   a first input device having a first input connected to said first voltage input, a second input connected to a current source and an output connected to said first comparator input;
   a second input device having a first input connected to said second voltage input, a second input connected to said current source and an output connected to said second comparator input;
   said first current memory being switchably connectable to said output of said first input device and said second current memory being switchably connectable to said output of said second input device.

5. The analog to digital converter according to claim 4, wherein said first current memory is connected between said output of said first input device and a reference line and said second switched current memory is connected between said output of said second input device and said reference line.

6. The analog to digital converter according to claim 5, wherein said reference line is a common ground.

7. The analog to digital converter according to claim 4, further comprising a second switch for shorting said first inputs of said first and second input devices together, said second switch being responsive to said first clock signal.

8. The analog to digital converter according to claim 4, wherein said first input of a said input device is connected to a said voltage input via a third switch, said third switch being responsive to a second clock signal.

9. The analog to digital converter according to claim 4, wherein each of said switches is a field effect transistor, the gate of which is connected to receive a said clock signal.

10. The analog to digital converter according to claim 4, wherein:
    said first input device is a field effect transistor, a gate of which is connected to said first voltage input, a source or a drain of which is connected to a current supply and the other of said drain or source of which is connected to said first comparator input;
    said second input device is a field effect transistor, a gate of which is connected to said second voltage input, a source or a drain of which is connected to a supply voltage and the other of said drain or source of which is connected to said first comparator input.

11. The analog to digital converter according to claim 1, wherein said analog to digital converter is fabricated on an integrated circuit.

12. The analog to digital converter according to claim 1, wherein said analog to digital converter is fabricated in an integrated circuit package.

* * * * *